(12) United States Patent
Maxim et al.

(10) Patent No.: US 7,750,704 B2
(45) Date of Patent: Jul. 6, 2010

(54) PROVIDING A LOW PHASE NOISE REFERENCE SIGNAL

(75) Inventors: Adrian Maxim, Austin, TX (US); James Kao, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 12/256,800

(22) Filed: Oct. 23, 2008

(65) Prior Publication Data

US 2009/0039935 A1 Feb. 12, 2009

Related U.S. Application Data

(62) Division of application No. 11/473,742, filed on Jun. 23, 2006, now abandoned.

(60) Provisional application No. 60/722,472, filed on Sep. 30, 2005.

(51) Int. Cl.
*H03K 12/00* (2006.01)
(52) U.S. Cl. ....................................................... 327/184
(58) Field of Classification Search ...................... None
See application file for complete search history.

(56) References Cited

FOREIGN PATENT DOCUMENTS

JP         2005-186850     *   6/2005

* cited by examiner

*Primary Examiner*—Lincoln Donovan
*Assistant Examiner*—Daniel Rojas
(74) *Attorney, Agent, or Firm*—Trop, Pruner & Hu, P.C.

(57) ABSTRACT

A reference clock generator includes an oscillator to generate a periodic signal, a shaping circuit and a filter. The shaping circuit shapes the periodic signal to generate a clock signal. The filter is located between the oscillator and the shaping circuit.

6 Claims, 5 Drawing Sheets

PROVIDING A LOW PHASE NOISE REFERENCE SIGNAL

This application is a divisional of U.S. patent application Ser. No. 11/473,742, entitled "PROVIDING A LOW PHASE NOISE REFERENCE CLOCK SIGNAL," filed on Jun. 23, 2006 now abandoned, which claims the benefit under 35 U.S.C. §119(e) to U.S. Provisional Application No. 60/722,472, filed on Sep. 30, 2005. Each of these applications is hereby incorporated by reference in its entirety.

BACKGROUND

The invention generally relates to providing a low phase noise reference clock signal, such as a reference clock signal for a phase locked loop, for example.

A modern communication system typically includes a tunable frequency synthesizer for purposes of generating mixing signals for the system. The frequency synthesizer typically includes a phase locked loop (PLL) and a reference clock generator that provides a reference clock signal to the PLL. The PLL generates the output signal for the synthesizer; and the frequency of the output signal typically is a multiple of the frequency of the reference clock signal. The frequency ratio typically is established by a programmable feedback divider of the PLL.

Modern wideband communications systems have frequency synthesizers that can be tuned over a very wide range at multi-GHz frequencies. It may be desirable for the PLL to have a relatively large bandwidth for purposes of rejecting phase noise that is generated by the controlled oscillator of the PLL. However, a large loop bandwidth may cause the reference clock signal to significantly contribute to the phase noise (i.e., the clock jitter) in the output signal of the synthesizer. The large ratio between the output clock frequency (in the GHz range, for example) and the reference clock frequency (in a tens of MHz range, for example) typically results in a large feedback divider modulus for the PLL and thus, a large gain for the phase noise and the spurious tones that exist in the reference clock path.

Thus, there exists a continuing need for a frequency synthesizer that has a reference clock signal path that introduces an insignificant amount of phase noise and spurious tones to the reference clock signal.

SUMMARY

In an embodiment of the invention, a reference clock generator includes an oscillator to generate a periodic signal, a shaping circuit and a filter. The shaping circuit shapes the periodic signal to generate a clock signal. The filter is located between the oscillator and the shaping circuit.

In another embodiment of the invention, a shaping circuit includes a first inverter to receive a sinusoidal signal and a chain of serially coupled inverters. The chain has an input terminal to receive the sinusoidal signal and an output terminal. The sizes of the inverters progressively increase from the input terminal to the output terminal.

In another embodiment of the invention, a frequency synthesizer includes a clock generator to generate a reference clock signal and a phase locked loop to lock onto the reference signal to generate an output signal. The clock generator includes an oscillator that has first transistors. Each of the first transistors have substantially a first gate oxide thickness. The phase locked loop includes a charge pump that has second transistors. Each of the second transistors has substantially a second gate oxide thickness that is substantially greater than the first gate oxide thickness.

In yet another embodiment of the invention, a frequency synthesizer includes a clock generator to generate a reference clock signal and a phase locked loop to lock onto the reference clock signal to generate an output signal. The clock generator includes an oscillator that has first transistors, and each of the first transistors has substantially a first gate oxide thickness. The phase locked loop includes a phase detector that has second transistors. Each of the second transistors has substantially a second gate oxide thickness that is substantially smaller than the first gate oxide thickness.

Advantages and other features of the invention will become apparent from the following drawing, description and claims.

DETAILED DESCRIPTION

Figure 1:
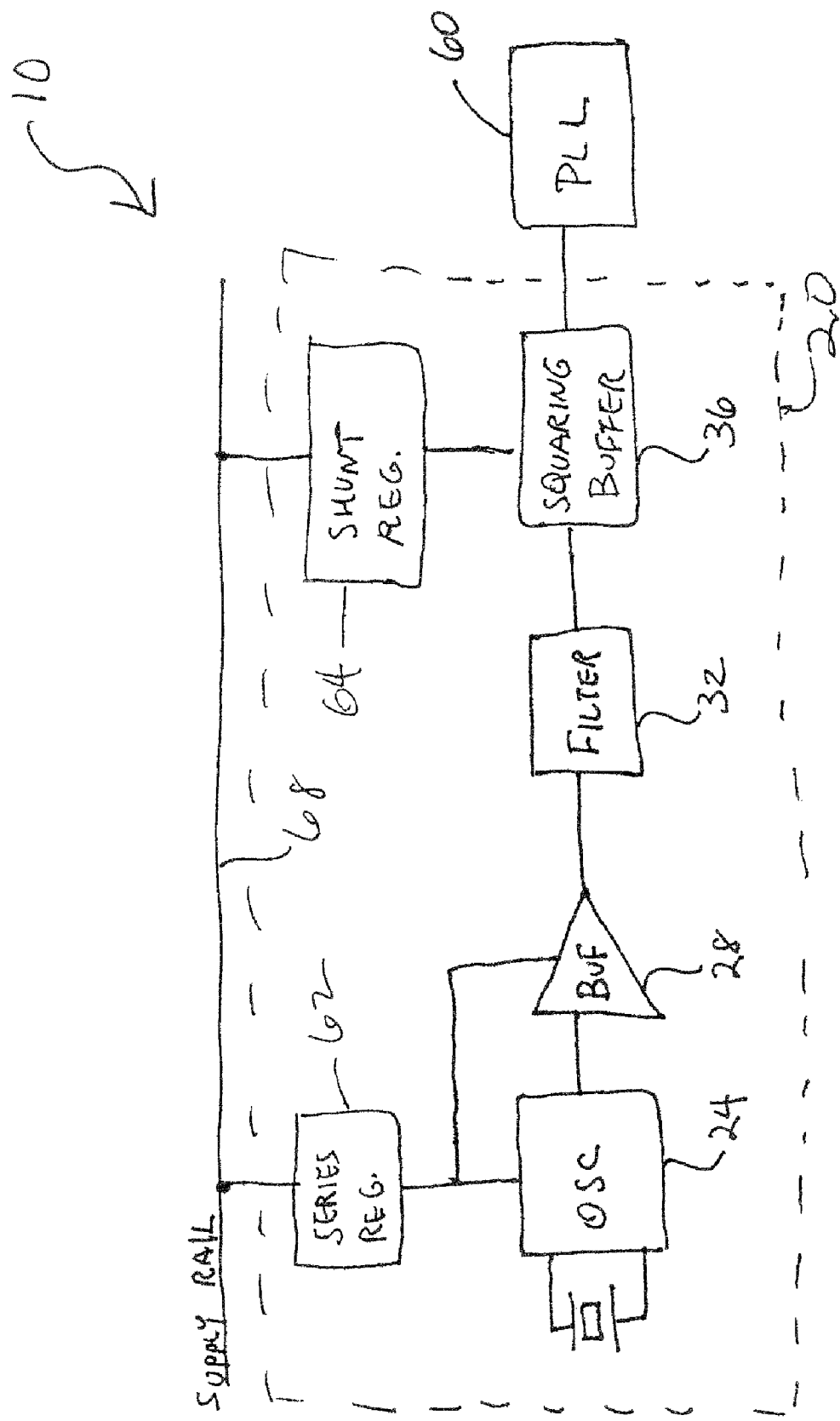
FIGS. 1, 2 and 3 are schematic diagrams of frequency synthesizers according to embodiments of the invention.

Referring to FIG. 1, an embodiment of a frequency synthesizer 10 in accordance with the invention includes a phase locked loop (PLL) 60 and a reference clock generator 20 that provides a reference clock signal to the PLL 60. The PLL 60, once locked onto the reference clock signal, provides an output signal that has a predetermined phase and frequency relationship to the reference clock signal. The PLL 60 has a relatively high bandwidth, which makes the PLL 60 potentially susceptible to phase noise and spurious tone contamination in the reference clock signal. However, as described below, the reference clock generator 20 has features that produce a reference clock signal that has relatively low phase noise and an insignificant level of spurious tone contamination.

It is noted that although a single PLL 60 is depicted in FIG. 1, in other embodiments of the invention, the frequency synthesizer 10 may generate multiple output signals having different frequencies and thus, may include multiple PLLs that receive the reference clock signal from the reference clock generator 20.

In accordance with some embodiments of the invention, the reference clock generator 20 includes a crystal reference oscillator 24 that generates a reference sinusoidal signal at its output terminal The sinusoidal signal, in turn, propagates through an isolation buffer 28 and a filter 32 before reaching a squaring buffer 36. The squaring buffer 36, in turn, reshapes the received sinusoidal signal to form the reference clock signal that is provided to the PLL 60.

More specifically, the squaring buffer 36 performs a nonlinear edge squaring operation that effectively corresponds to a phase sampling operation that is capable of upconverting and downconverting phase noise and spurs that are parasitically coupled to the main signal path that carries the main sinusoidal signal. Therefore, the squaring buffer 36 is capable of producing noise and spurs in a band near the carrier frequency of the signal that is produced by the PLL 60, which means the PLL 60 may be incapable of filtering out these tones and spurs. However, the filter 32 is used to filter out noise and spurs from the signal that is provided to the squaring buffer 32 for purposes of preventing the up and down conversion of the noise and spurs, in accordance with some embodiments of the invention.

As a more specific example, in accordance with some embodiments of the invention, the filter 32 may be a relatively low order passive filter that may be formed, for example, from a resistor-capacitor (R-C) network. It is noted that in accordance with some embodiments of the invention, the reference clock generator 20 may include one or more additional higher order filters for purposes of increasing the effectiveness of the high frequency noise and spur rejection.

The isolation buffer 28, in accordance with some embodiments of the invention, represents another measure that is used to prevent noise and spurs from propagating from the reference clock generator 20. The isolation buffer 28 is used to drive the long reference clock lines (that present a high parasitic capacitance) without significantly loading the reference oscillator 24. More specifically, if a square wave-looking reference clock signal is transmitted over a relatively long signal path between the oscillator 24 and the squaring buffer 36, the resultant long metal wire connection may radiate a considerable amount of reference clock harmonics, which may be coupled into other sensitive analog blocks of a system that incorporates the frequency synthesizer 10. The long distance may be especially true for the case in which the clock generator 20 supplies a reference clock signal to several PLLs 60 that are distributed in a particular integrated circuit. Therefore, it is preferred to drive long wires with sinusoidal-looking signals and convert these signals locally into square wave clock signals for local blocks.

In a large mixed signal analog and digital integrated circuit, the supply lines may be contaminated with spurious tones and noise. The noise and spurious tones on the supply lines may be due to, as examples, several PLLs or frequency synthesizers existing on the same integrated circuit; other integrated circuits operating on the same printed circuit board (PCB); and/or various PLL blocks.

The components of the frequency synthesizer 10 ultimately receive their power from a voltage supply rail 68. However, different regulators are used to directly power the components of the frequency synthesizer 10 for purposes of preventing noise from contaminating the reference clock path and for purposes of preventing noise that is generated by the reference clock generator 20 from propagating outside of the generator 20.

More specifically, as depicted in FIG. 1, in accordance with some embodiments of the invention, the oscillator 24 and the isolation buffer 28 are not connected directly to the supply rail 68; but rather, the oscillator 24 and the isolation buffer 28 receive their supply voltages from a series regulator 62 that, in turn, is connected to the supply rail 68. The series regulator 62 provides a relatively high forward power supply rejection ratio (PSRR), which means the regulator 62 significantly attenuates spurious tones from the supply rail 68 from propagating or being coupled into the reference clock path before the non-linear squaring operation by the squaring buffer 36. The series regulator 62 needs to have very low output noise performance in order to limit phase noise degradation of the clock signal. The noise (white, colored or 1/f noise), if present, may dominate the noise that is propagates through the squaring buffer 36 and thus, may be up or down converted to a frequency near the carrier frequency of the PLL 60 by the squaring buffer 36.

Unlike the power supply connections for the oscillator 24 and the buffer 28, in accordance with some embodiments of the invention, the squaring buffer 36 receives its input power through a shunt regulator 64. Thus, the shunt regulator 64 is connected to the supply rail 68 and provides a supply voltage to the squaring buffer 36. The shunt regulator 64 has a high forward PSRR, and unlike the series regulator 62, also has a high reverse PSRR. The forward isolation minimizes the amount of spurious tones that are present, which may be down-converted around the reference clock carrier and then amplified by the PLL 60 forward gain. The high reverse PSRR means that the shunt regulator 64 significantly attenuates any noise contamination to the supply rail 68 (and thus, to the global integrated circuit supply lines) by the harmonics of the reference clock signal, which may coupled into other sensitive analog blocks that are coupled to the supply rail 68.

In accordance with some embodiments of the invention, the gate thicknesses of the complementary metal oxide semiconductor (CMOS) devices that form the frequency synthesizer 10 may be selected for purposes of minimizing noise and spurious tones in the reference clock path. For example, referring to FIG. 2, in accordance with some embodiments of the invention, a frequency synthesizer 80 uses relatively low amplitude signals and in general uses thin oxide devices for purposes of minimizing noise and spurious tones in the reference clock path.

More specifically, similar to the overall topology of the clock generator 20 (FIG. 1), a clock generator 90 of the frequency synthesizer 80 includes a crystal-based oscillator 92, an isolation buffer 96, a filter 98 and a squaring buffer 100. The crystal oscillator 92 uses thin oxide devices for their lower l/f noise and also uses relatively lower bias currents for a given transconductance level. Similarly, the buffer 96, if used, includes relatively thin oxide devices. The filter 98 may be a passive filter (as an example) and thus, may not contain any CMOS devices. The squaring buffer 100 also contains thin oxide devices.

Figure 2:
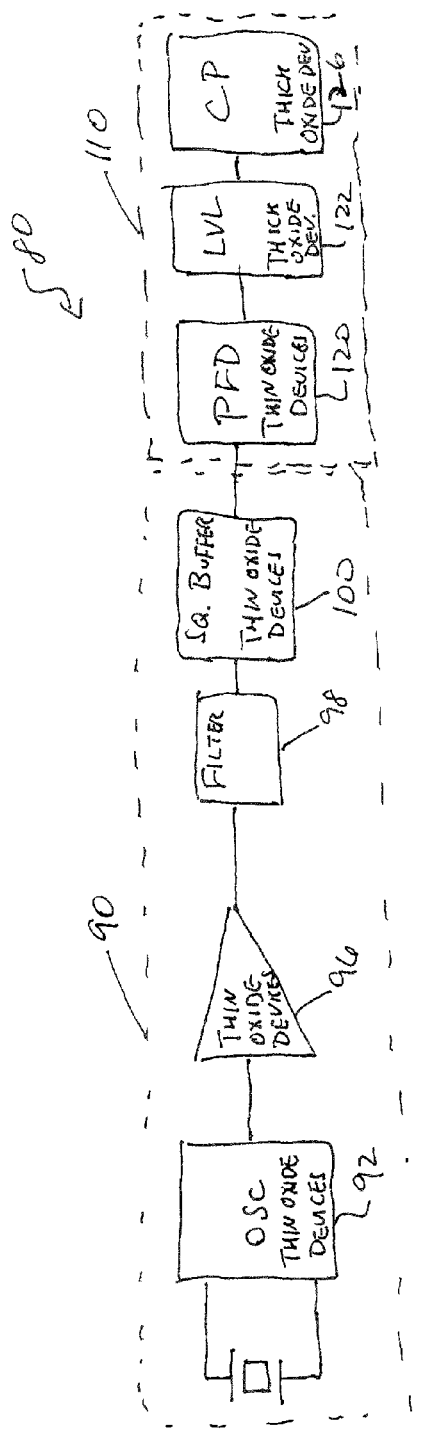
Figure 3:
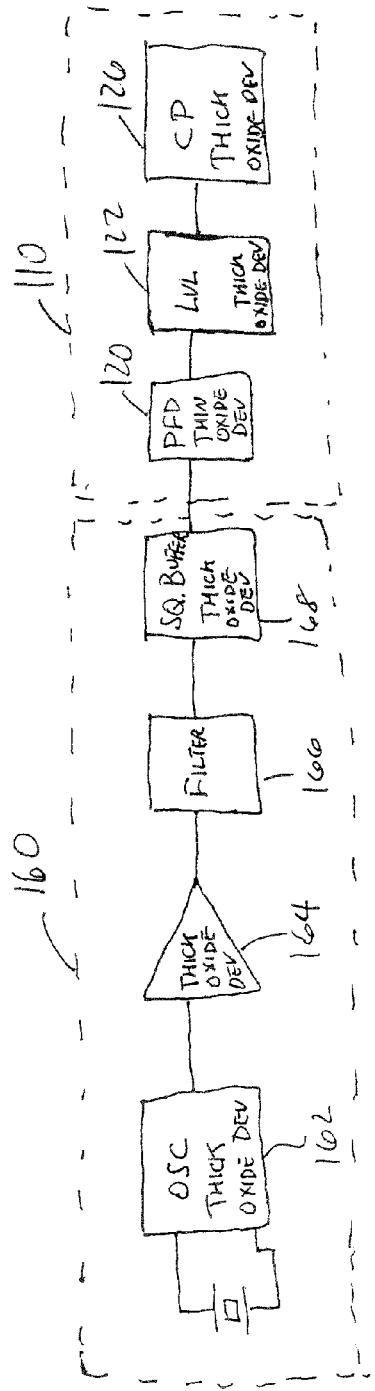

The use of the thin oxide devices may continue with the devices of a PLL 110 of the frequency synthesizer 80. More specifically, a phase detector 120 of the PLL 110 may have relatively thin oxide devices to ensure a minimum width up/down reset pulse, which provides dead-zone-free operation. The PLL 110 also includes a charge pump 126 that uses relatively thick oxide devices to allow a wide oscillator control voltage range which ensures a low gain of the VCO (not shown) of the PLL 110 in light of a low upconversion gain. As also depicted in FIG. 2, the PLL 110 may include level shifters 122 that have relatively thick oxide devices 122. The noise contribution of the level shifters is negligible due to the fast clock edge rates at their input.

In accordance with other embodiments of the invention, a frequency synthesizer 150 that is constructed to use higher signal magnitudes than the frequency synthesizer 80 may use the PLL 110 with another reference clock generator 160. Similar to the overall topologies of the clock generators 90 and 20, the reference clock generator 160 includes a crystal-based oscillator 162, an isolation buffer 164, a filter 166 and a squaring buffer 168. Unlike the reference clock generator 90, the reference clock generator 160 generally uses thick oxide devices and operates using relatively larger magnitude signals in the reference clock path. Therefore, the crystal-based oscillator 162 and the isolation buffer 164 use the thick oxide devices. Due to its thick oxide devices, the squaring buffer 168 may handle a relatively large amplitude sinusoidal signal that is generated by the oscillator 162. The large magnitude signals generally reduce the degree of phase noise in the reference clock signal.

Figure 4:
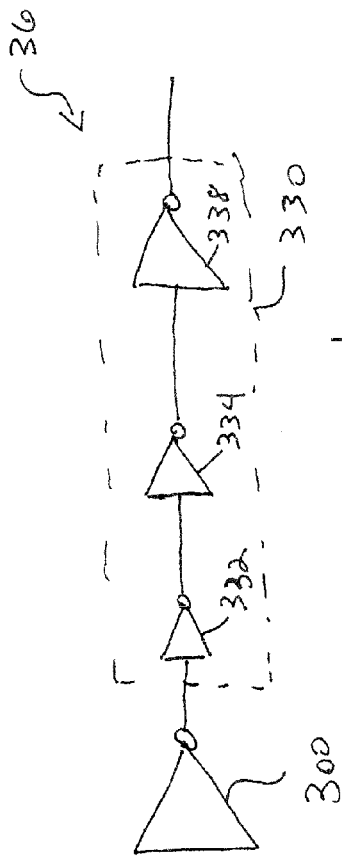
FIG. 4 is a schematic diagram of a squaring buffer according to an embodiment of the invention.

Referring to FIG. 4, in accordance with some embodiments of the invention, the squaring buffer 36 is formed from a chain of CMOS inverters. In order for the squaring buffer 36 to be effective, the buffer 36 needs to boost the rate (called the "edge speed" herein) at which the positive and negative going edges of the received signal change. To accomplish this, the squaring buffer 100 boosts the edge speed starting with a first inverter 300 of the squaring buffer 36.

In general, the faster the edge speed, the lower the sensitivity to the supply noise and also the device intrinsic noise. If a gradual scaling up of the edge speed is realized along the inverter chain, then each inverter of the chain contributes significant noise to the reference clock signal. Therefore, instead of such an approach, the first inverter 300 of the chain is made sufficiently strong to speed up the edges of the received sinusoidal signal so that the following inverter stages 332, 334 and 338 have negligible impacts on the reference path noise.

In the context of this application, a "strong" or "large" inverter means an inverter that has relatively larger complimentary metal oxide (CMOS) devices than another inverter. In other words, the n-channel metal-oxide-semiconductor field effect transistor (NMOSFET) and p-channel metal-oxide-semiconductor field effect transistor (PMOSFET) devices of a "strong" CMOS inverter have significantly larger aspect ratios than the NMOSFET and PMOSFET devices of a "weak" inverter.

To ensure a very fast speed on the load of the output of the first inverter 300, the load present on the output terminal of the first inverter 300 is minimized. Therefore, the size of the second inverter 332 of the chain is made significantly smaller than the size of the first inverter 300. The third inverter 334 is made larger than the second inverter 332, and the fourth inverter 338 is made larger than the third inverter 334. Thus, after the first inverter 300, the sizes of the inverters 332, 334 and 338 monotonically increase in size, thereby using a graduated approach to gradually and monotonically increase the drive capability. The fourth inverter 338 has a sufficient size to provide the reference clock signal to the PLL.

After the edges are fast enough, minimal gain is necessary to keep the edges squared. Therefore, after the edges are squared by the first inverter 300, the remaining inverter chain are mainly used for purposes of maintaining a large bandwidth for the squaring buffer 36.

Figure 5:
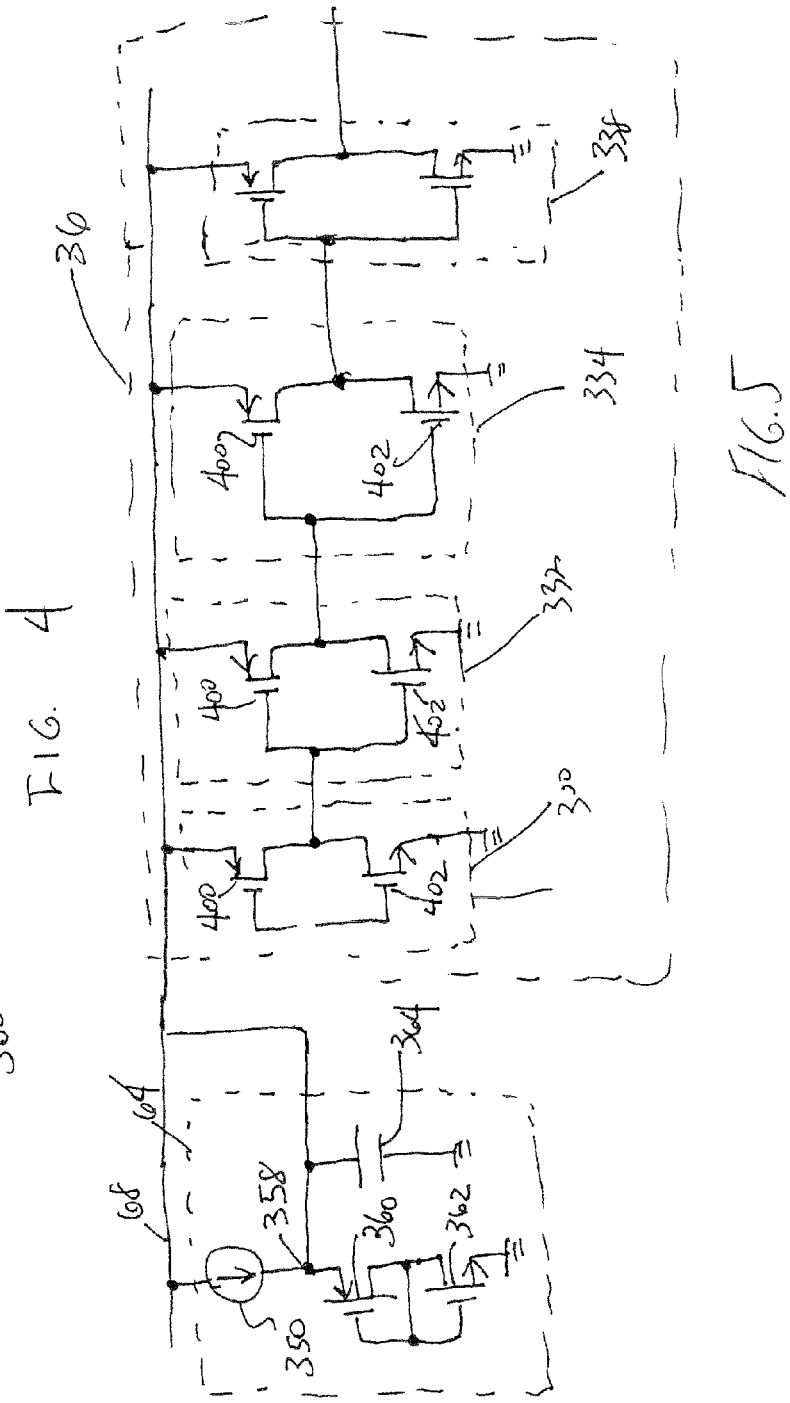
FIG. 5 is a more detailed schematic diagram of the squaring buffer according to an embodiment of the invention.

Referring to FIG. 5, in accordance with some embodiments of the invention, the shunt regulator 64 may be an open loop shunt regulator that includes a current source 350 that is coupled to the supply rail 68 to provide a bias current to an output terminal node 358 of the regulator 64. Two diodes that are formed from a PMOSFET 360 and an NMOSFET 362 are serially coupled between the node 358 and ground to establish the voltage level of the output terminal node 358. Thus, the drain and gate terminals of the PMOSFET 360 and the NMOSFET 362 are coupled together. As also depicted in FIG. 5, a filtering capacitor 364 may be coupled between the output terminal node 358 and ground.

As shown in FIG. 5, in accordance with some embodiments of the invention, each of the inverters 332, 334 and 338 may be a complimentary metal oxide semiconductor (CMOS) inverter that is formed from a PMOSFET 400 and an NMOSFET 402. The source terminal of the NMOSFET 402 is coupled to ground; the gate terminals of the NMOSFET 402 and the PMOSFET 400 are coupled together to receive an input signal; the drain terminals of the PMOSFET 400 and the NMOSFET 402 are coupled together to form an output terminal for the inverter; and the source of the PMOSFET 400 is coupled to the output node 358.

Figure 6:
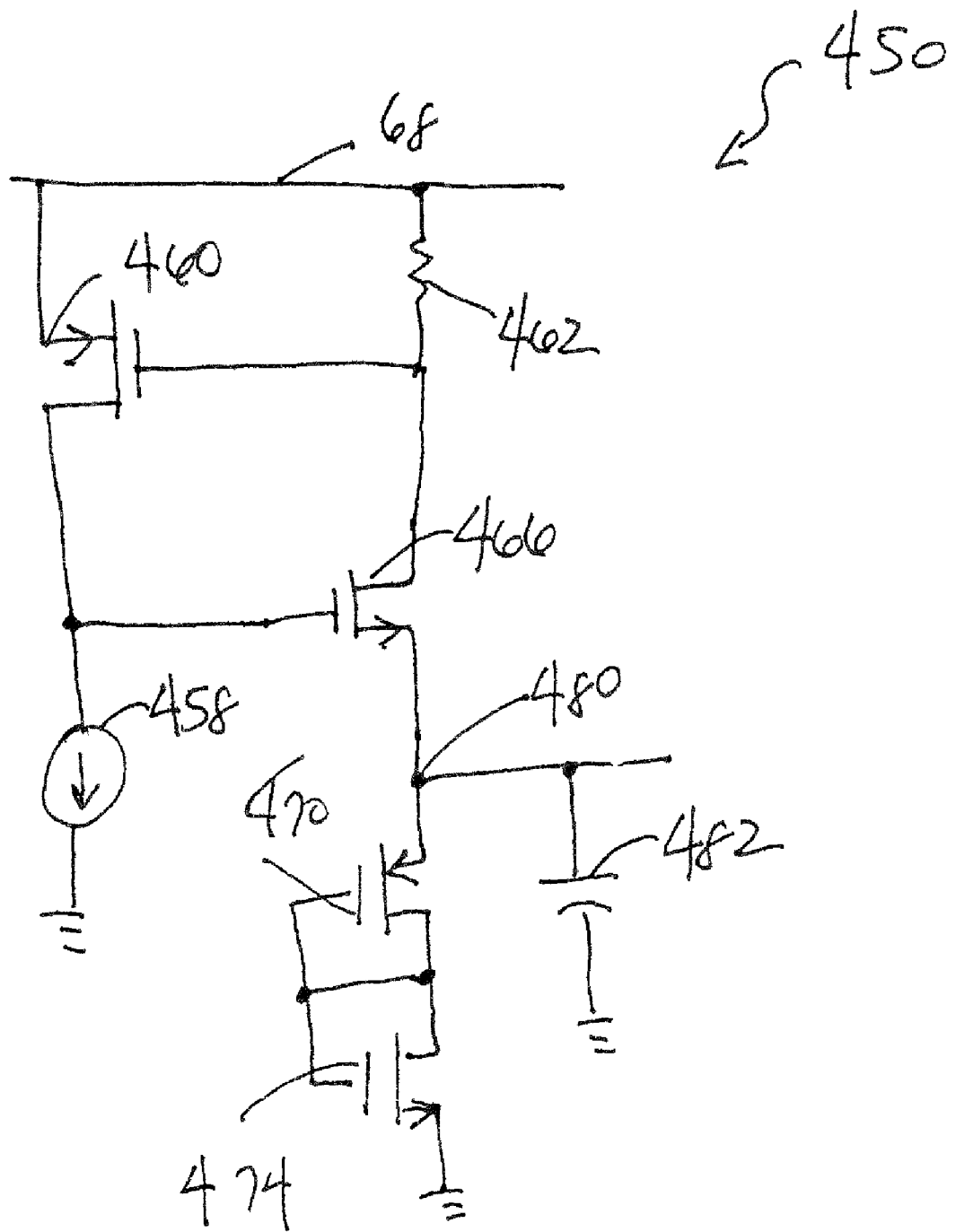
FIG. 6 is a schematic diagram of an alternative closed-loop shunt regulator for use with the squaring buffer according to an embodiment of the invention.

Alternatively, referring to FIG. 6, in accordance with some embodiments of the invention, the open-loop shunt regulator may be replaced by a closed loop shunt regulator 450 in accordance with some embodiments of the invention. The shunt regulator 450 includes two CMOS diodes formed from a PMOSFET 470 and an NMOSFET 474 that are serially coupled between an output node 480 and ground. Thus, in general, the voltage drop across the CMOS diodes provides the regulated output voltage for the regulator 450. Additionally, a capacitor 482 is coupled between the output node 480 and ground.

The shunt regulator 450 includes additional circuitry to regulate the voltage of the node 480. In particular, the shunt regulator 450 includes a current source 458 that supplies current that flows through the source-to-drain path of a PMOSFET 460. The source terminal of the PMOSFET 460 is coupled to the supply rail 68. The gate-to-source voltage of the PMOSFET 460 is coupled in parallel with a resistor 462. Thus, the bias current that is established by the current source 458 establishes a given current flow through the resistor 462. The drain-to-source path of an NMOSFET 466 is serially coupled to receive the current through the resistor 462. The drain terminal of the NMOSFET 466 is coupled to the gate terminal of the PMOSFET 460, and the source terminal of the NMOSFET 466 is coupled to the output node 480. The gate terminal of the NMOSFET 466 is coupled to the drain terminal of the PMOSFET 460. Due to this arrangement, the NMOSFET 466 provides the current to the supply node 480 as needed to regulate the voltage of the node 480.

Figure 7:
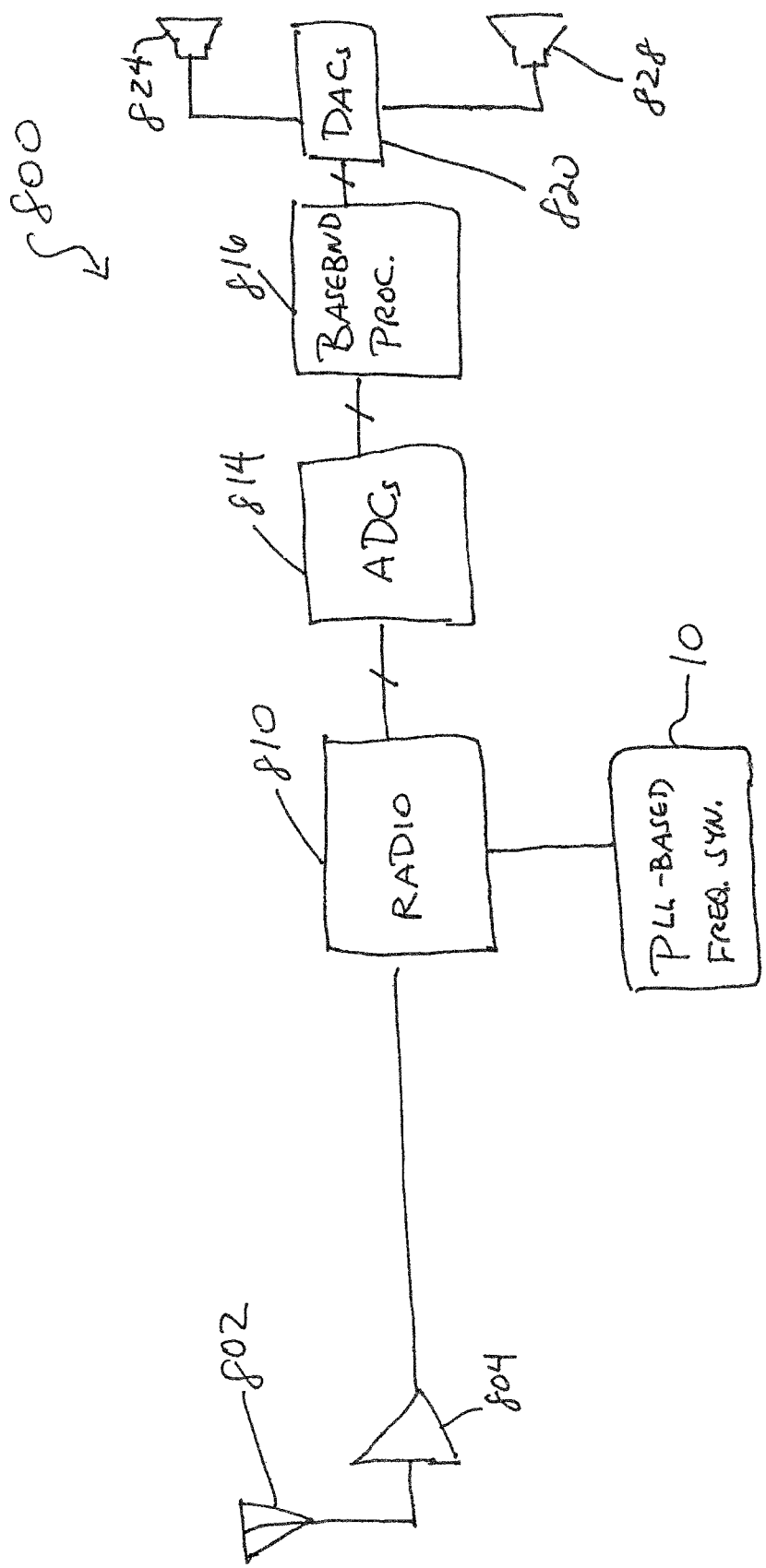
FIG. 7 is a schematic diagram of a wireless system according to an embodiment of the invention.

Referring to FIG. 7, in accordance with some embodiments of the invention, the frequency synthesizer 10 may be part of a wireless system 800. As examples, the wireless system 800 may be a portable wireless device, such as a cellular telephone, a personal digital assistant (PDA), or a portable computer, as just a few examples. It is noted that the wireless system 800 may be a more non-portable device, such as a desktop computer. Thus, many variations are possible and are within the scope of the appended claims. The wireless system 800 includes, for example, a transceiver that may include a low noise amplifier (LNA) 804 that receives an RF signal from an antenna 802, a radio 810, analog-to-digital converters (ADCs) 814, a baseband processor 816 and digital-to-analog converters (DACs) 820, and the frequency synthesizer 10.

All of the components of the wireless system 800 described above may be fabricated on a single die and may be part of the same semiconductor package, in accordance with some embodiments of the invention. In other embodiments of the invention, the above-described components may be fabricated on separate dies of a single semiconductor package. In yet other embodiments of the invention, the above-described components may be part of separate semiconductor packages. Thus, many variations are possible and are within the scope of the appended claims.

The LNA 804 receives an RF signal from an antenna 802 and provides an amplified version of the incoming RF signal to a radio 810. The radio 810 receives one or more mixing signals from the frequency synthesizer 10 for purposes of translating the incoming RF signal to a lower baseband frequency. The resultant signal is provided to the ADCs 814 that produce baseband signals in response thereto. The baseband processor 816 may, for example, de-modulate the signals provided by the ADC 814 and provide the resultant de-modulated signals to the DACs 820. The DACs 820, in turn, may provide audio signals for speakers 824 and 828.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A shaping circuit comprising:
a chain of serially coupled inverters having an input terminal to receive a sinusoidal signal and an output terminal, the chain of serially coupled inverters comprising a first inverter closer to the input terminal than the other inverters and a second inverter of said other inverters connected to an output terminal of the first inverter,
wherein the sizes of said other inverters progressively increase from the second inverter to the output terminal of the chain, and the size of the first inverter is larger than the second inverter.

2. The shaping circuit of claim 1, wherein the first inverter and said other inverters are complementary metal oxide semiconductor inverters.

3. The shaping circuit of claim 1, wherein the chain of serially coupled inverters convert the sinusoidal signal into a clock signal, and the first inverter substantially establishes an edge speed of the clock signal.

4. A method comprising:
providing a chain of serially coupled inverters to convert a sinusoidal signal received at an input terminal of the chain into a clock signal provided at an output terminal of the chain;
coupling a first inverter of the chain closer to the input terminal than the other inverters;
connecting a second inverter of said other inverters to an output terminal of the first inverter, the size of the first inverter being larger than the size of the second inverter; and
progressively increasing the sizes of said other inverters from an output terminal of the first inverter to the output terminal of the chain.

5. The method of claim 4, wherein the first inverter and said other inverters are complementary metal oxide semiconductor inverters.

6. The method of claim 4, wherein the first inverter substantially establishes an edge speed of the clock signal.

* * * * *